United States Patent [19]
Mori

[11] Patent Number: 5,063,430
[45] Date of Patent: Nov. 5, 1991

[54] SEMICONDUCTOR INTEGRATED CIRCUIT DEVICE HAVING STANDARD CELLS INCLUDING INTERNAL WIRING REGION

[75] Inventor: Shojiro Mori, Yokohama, Japan

[73] Assignee: Kabushiki Kaisha Toshiba, Kawasaki, Japan

[21] Appl. No.: 649,139

[22] Filed: Jan. 30, 1991

Related U.S. Application Data

[63] Continuation of Ser. No. 476,577, Feb. 7, 1990, abandoned.

[30] Foreign Application Priority Data

Apr. 27, 1989 [JP] Japan .................................. 1-108713

[51] Int. Cl.$^5$ .......................................... H01L 27/10
[52] U.S. Cl. ........................................ 357/45; 357/41; 357/71
[58] Field of Search ................... 357/45 M, 45, 71, 41

[56] References Cited

FOREIGN PATENT DOCUMENTS

| 58-078450 | 5/1983 | Japan | 357/45 M |
|---|---|---|---|
| 58-087854 | 5/1983 | Japan | 357/45 M |
| 59-079549 | 5/1984 | Japan | 357/45 M |
| 60-175438 | 9/1985 | Japan | 357/45 M |
| 62-128152 | 6/1987 | Japan | 357/45 M |
| 63-099545 | 4/1988 | Japan | 357/45 |

Primary Examiner—Jerome Jackson, Jr.
Assistant Examiner—Hung Xuan Dang
Attorney, Agent, or Firm—Finnegan, Henderson, Farabow, Garrett, and Dunner

[57] ABSTRACT

A semiconductor integrated circuit device includes a plurality of standard cell rows each including first standard cells and wiring regions each of which is arranged between any two adjacent ones of the standard cell rows and in which cell connection wirings are formed, wherein the standard cell row includes at least one second standard cell and the second standard cell includes an internal wiring region in which cell connection wirings are formed.

5 Claims, 5 Drawing Sheets

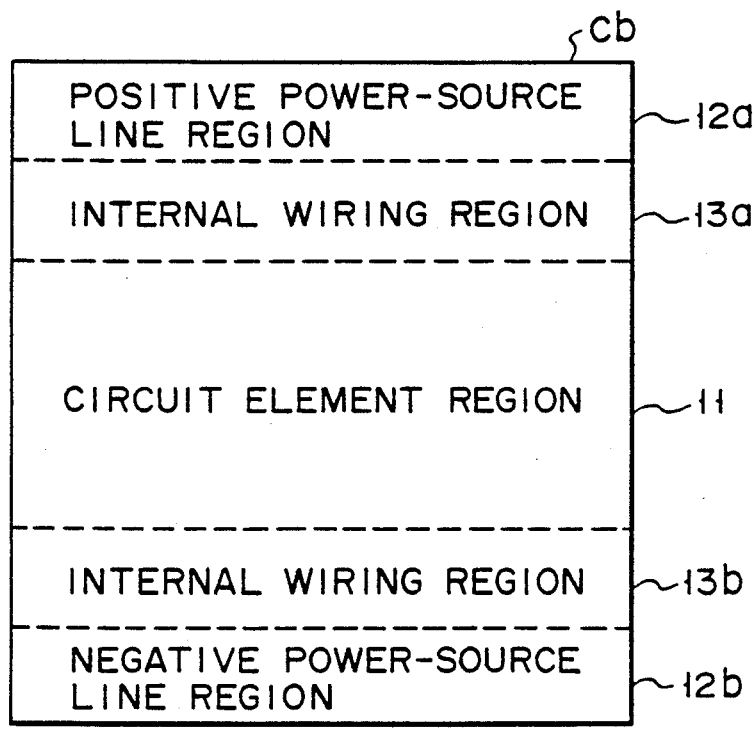
F I G. 3
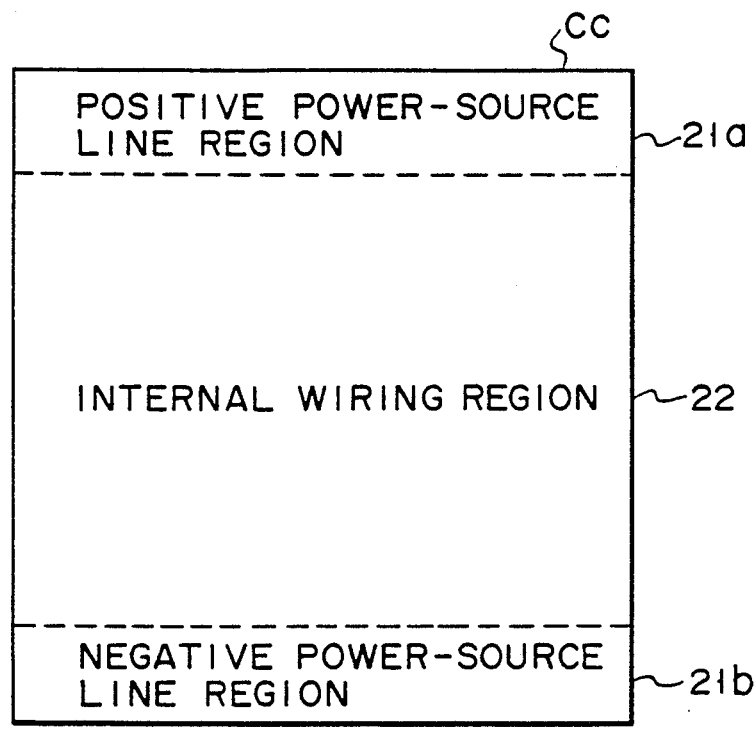
F I G. 4

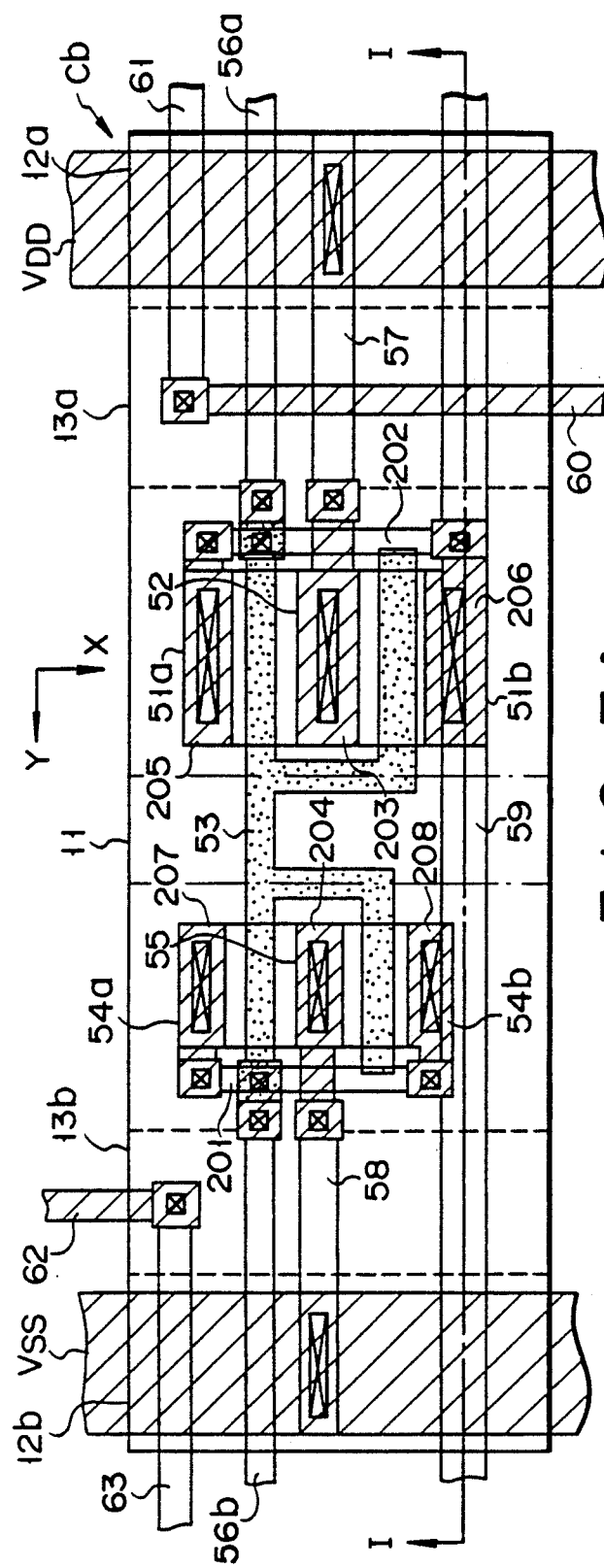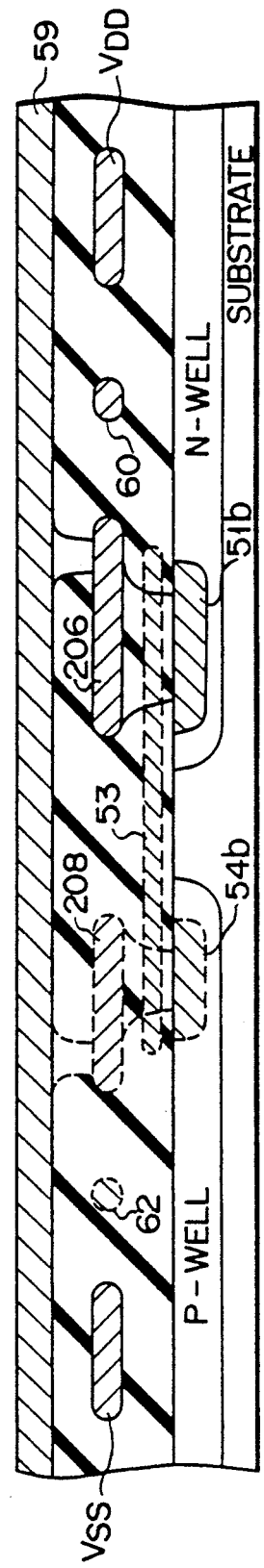
FIG. 7A
FIG. 7B

SEMICONDUCTOR INTEGRATED CIRCUIT DEVICE HAVING STANDARD CELLS INCLUDING INTERNAL WIRING REGION

This application is a continuation of application Ser. No. 07/476,577, filed Feb. 7, 1990, now abandoned.

BACKGROUND OF THE INVENTION

1. Field of the Invention

This invention relates to a semiconductor integrated circuit device constituted by standard cells, and more particularly to the construction of a standard cell suitable for reducing the width of a wiring region arranged between cell rows.

2. Description of the Related Art

In general, when an LSI layout pattern is designed using standard cells, several types of logic gates (for example, inverters, two-input ANDs and three-input NORs) are laid out inside a rectangular area with a constant height and are registered as standard cells. A desired LSI is realized by arranging the cells and wiring them according to a given logic design.

As shown in FIG. 1, the conventional standard cell is constructed of a positive power source line region 1, a circuit element region 2 and a negative power source line region 3. As described before, gate circuits such as inverters are formed in the circuit element region 2, for example. A power source voltage for driving the gate circuits is supplied via positive and negative power source lines respectively formed in the positive and negative power source line regions 1 and 3.

The standard cells with the above construction are arranged as shown in FIG. 2, and the wiring for the cells is made in a wiring region 102 lying between cell rows 101 and 103. In this case, the wiring layout in the wiring region 102 is determined according to the logic function of the LSI to be realized, and therefore it is sometimes necessary to form a large number of wirings in one wiring region in order to attain a desired logic function. In FIG. 2, an example of the wiring layout is shown in which a cell C3 of the first cell row 101 and a cell C11 of the second cell row 103 are connected to each other via a wiring L1, cells C2 and C8 of the first cell row 101 are connected to each other via a wiring L2 and cell C5 of the first cell row 101 is connected to cells C7 and C6 via wirings L3 and L4 respectively. In this case, since at least three wirings are formed in parallel with the cell row in the wiring region as shown in FIG. 2, it becomes necessary to increase the width of the wiring region.

Thus, when the wirings are formed with high density in a partial area in the standard cell type LSI, it is necessary to increase the width of the wiring region. The LSI is generally formed of a plurality of cell rows, and wiring regions are arranged between the adjacent cell rows. Therefore, as the width of the wiring region becomes larger, the chip area of the LSI becomes larger. As a result, an LSI using the conventional standard cells requires a large chip area.

SUMMARY OF THE INVENTION

An object of this invention is to provide a semiconductor integrated circuit device in which the width of the wiring region arranged between cell rows can be reduced.

According to this invention, there is provided a semiconductor integrated circuit device comprising a plurality of standard cell rows each including first standard cells and wiring regions each of which is arranged between any two adjacent ones of the standard cell rows and in which cell connection wirings are formed, wherein the standard cell row includes at least one second standard cell and the second standard cell has an internal wiring region in which cell connection wirings are formed.

In the above semiconductor integrated circuit device, the second standard cell can be formed in a partial area in which the wirings are densely formed so that part of the wirings can be formed in the internal wiring region of the second standard cell. Therefore, the width of the wiring region between the cell rows can be reduced, thereby achieving an LSI having a small chip area.

BRIEF DESCRIPTION OF THE DRAWINGS

FIG. 3 is a diagram showing a first embodiment of a standard cell which can be applied to the semiconductor integrated circuit device of this invention;

FIG. 4 is a diagram showing a second embodiment of a standard cell which can be applied to the semiconductor integrated circuit device of this invention;

FIG. 7A is a plan view showing a concrete wiring pattern obtained in a case where an inverter circuit is formed in the cell of FIG. 3;

FIG. 7B is a cross sectional view showing the cross section taken along line I—I of FIG. 7A.

DETAILED DESCRIPTION OF THE PREFERRED EMBODIMENTS

Figure 1:
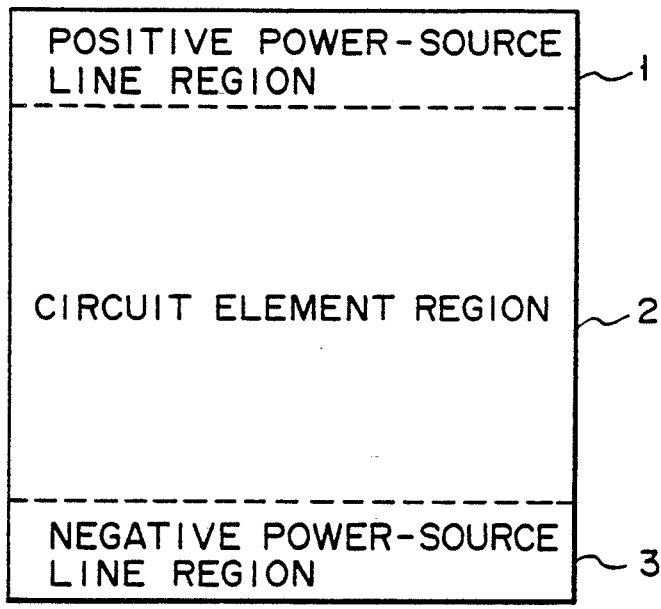
FIG. 1 is a diagram showing the construction of the conventional standard cell.
Figure 2:
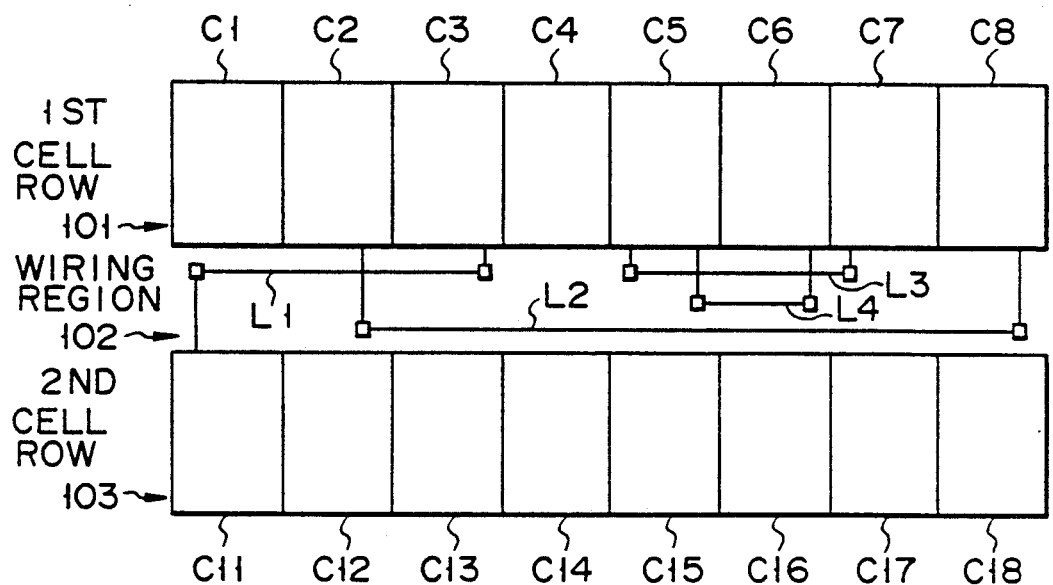
FIG. 2 is a diagram showing the cell arrangement of cell rows including cells shown in FIG. 1, and the wiring layout pattern thereof.

FIG. 3 shows a first embodiment of a standard cell used in a semiconductor integrated circuit device of this invention. The standard cell Cb includes a circuit element region 11, a positive power source line region 12a, a negative power source line region 12b and internal wiring regions 13a and 13b. In the circuit element region 11, a desired logic gate (for example, an inverter, two-input NAND gate, three-input NOR gate) is formed. Positive and negative power source lines are formed in the positive and negative power source line regions 12a and 12b, respectively. The power source lines are used to supply a power source voltage to the logic gate formed in the circuit element region 11. The internal wiring regions 13a and 13b are used to form wirings for connecting cells to one another.

FIG. 4 shows a second embodiment of a standard cell used in the semiconductor integrated circuit device of this invention. The standard cell Cc includes a positive power source line region 21a, a negative power source line region 21b and an internal wiring region 22. Thus, the cell Cc is different from the cell Cb in that no circuit element region is formed. That is, the cell Cc is a special cell used only for wiring the cells to one another and does not function as a circuit element.

Figure 5:
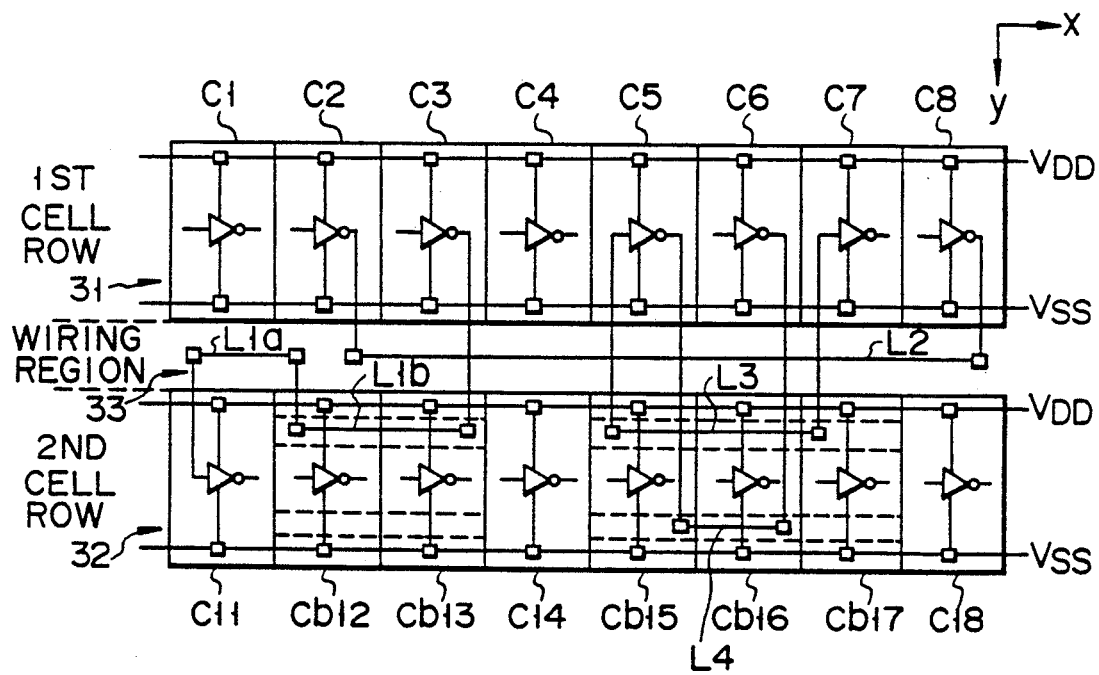
FIG. 5 is a diagram showing the cell arrangement of cell rows, including standard cells shown in FIG. 3, and the wiring layout pattern thereof.

Now, the wiring pattern and the concrete arrangement of cell rows constituted by using the standard cells Cb of FIG. 3 will be explained, with reference to FIG. 5. As shown in FIG. 5, a first cell row 31 is constituted by standard cells C1 to C8 arranged in X direction. The standard cells C1 to C8 are formed with a normal structure as shown in FIG. 1. A second cell row 32 is constituted by standard cells C11, Cb12, Cb13, C14, Cb15, Cb16, Cb17 and C18 arranged in the X direction. The standard cells C11, C14 and C18 are formed with a normal construction as shown in FIG. 1 and the standard cells Cb12, Cb13, Cb15, Cb16 and Cb17 are formed with a construction of the first embodiment as shown in FIG. 3. A wiring region 33 is provided between the first and second cell rows 31 and 32.

An inverter in the cell C11 and an inverter in the cell C3 are connected to each other by means of wirings L1a and L1b. The wiring L1a is formed in the wiring region 33 and the wiring L1b is formed in the internal wiring regions of the cells C12 and Cb13 in the second cell row 32. Inverters of the cells C5 and C7 are connected to each other by means of a wiring L3 formed in the internal wiring regions of the cells Cb15, Cb16 and Cb17 in the second cell row 32. Further, inverters of the cells C5 and C6 are connected to each other by means of a wiring L4 formed in the internal wiring regions of the cells Cb15 and Cb16 in the second cell row 32.

Like the positive power source line VDD and negative power source line Vss, the respective wirings formed in the internal wiring regions of the cells Cb12, Cb13, Cb15, Cb16 and Cb17 are formed so as to extend in the X direction in parallel with the cell rows 31 and 32. Further, input and output wirings of the inverters formed in the cells are formed to extend in a Y direction perpendicular to the cell rows 31 and 32. The wirings extending in the X direction and the wirings extending in the Y direction are arranged in three dimensions or in different levels so as to be electrically isolated from each other. The wirings extending in the X direction and the wirings extending in the Y direction can be electrically connected via contact portions (indicated by a symbol "□").

In a case where the above cells are formed on a semiconductor chip, the wiring extending in the X direction may be formed of a first aluminum layer and the wiring extending in the Y direction may be formed of a second aluminum layer which is formed above the first aluminum layer with an insulation layer disposed therebetween.

In this way, the number of wirings formed in the wiring region 33 can be reduced by connecting the cells to one another by using the internal wiring regions of the standard cells. As a result, the wirings between the cells can be freely laid out without increasing the width of the wiring region between the cell rows.

Figure 6:
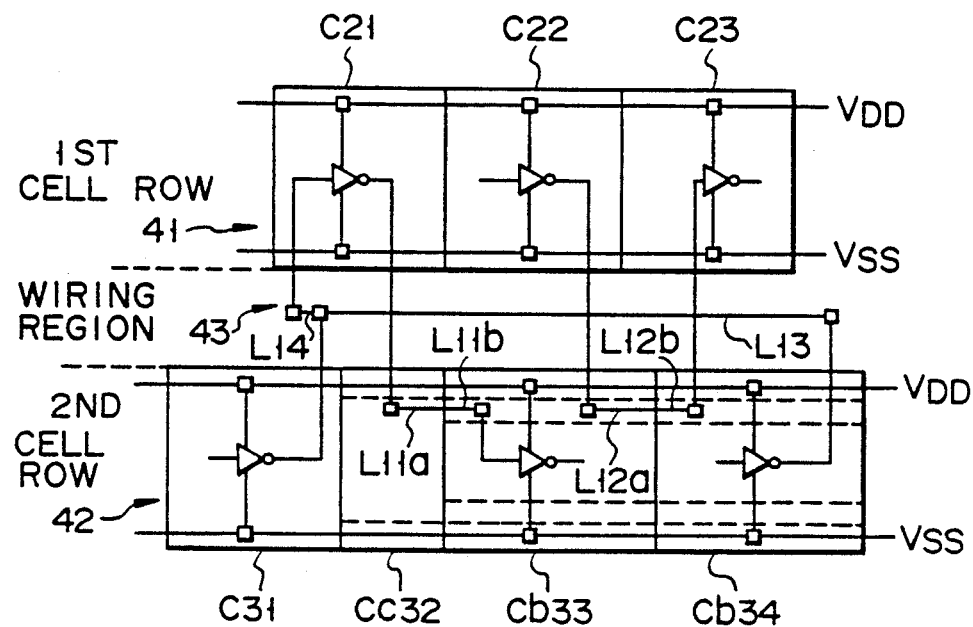
FIG. 6 is a diagram showing the cell arrangement of cell rows, including cells shown in FIGS. 3 and 4, and the wiring layout pattern thereof.

FIG. 6 shows the wiring pattern and the concrete arrangement of cell rows formed by using cells Cb of FIG. 3 and cells Cc of FIG. 4. As shown in FIG. 6, standard cells C21 to C23 of a first cell row 41, and a standard cell C31 of a second cell row 41 are formed to have the normal construction shown in FIG. 1. Standard cells Cb33 and Cb34 of the second cell row 42 are formed to have the construction of the first embodiment shown in FIG. 3 and a standard cell Cc32 of the second cell row 42 is formed to have the construction of the second embodiment shown in FIG. 4.

An inverter formed in the cell C21 of the first cell row 41 is connected to an inverter formed in the cell Cb33 via a wiring L11a formed in the internal wiring region of the cell Cc32 and a wiring L11b formed in the internal wiring region of the cell Cb33. Further, inverters formed in the cells C22 and C23 of the first cell row 41 are connected to each other by means of wirings L12a and L12b formed in the internal wiring regions of the cells Cb33 and Cb34 of the second cell row 42. An inverter formed in the cell C21 of the first cell row 41 is connected to respective inverters formed in the cells C31 and Cb34 of the second cell row 42 by means of wirings L13 and L14 formed in the wiring region 43.

Since the cell Cc32 has no element region, it can be disposed between desired cells irrespective of the circuit function to be realized. Therefore, the width of the wiring region 43 can be reduced by using the cell Cc32, and the degree of freedom for the wiring layout can be further enhanced.

FIG. 7A shows a concrete plane pattern obtained in a case where an inverter is formed in the circuit element region of the cell Cb shown in FIG. 3, and FIG. 7B shows the cross section taken along line I—I of FIG. 7A.

In FIGS. 7A and 7B, all the wirings extending in the X direction, except the wirings formed in the circuit element region 11, can be formed of the first aluminum layer and all the wirings formed to extend in the Y direction, except the wirings formed in the circuit element region 11, can be formed of the second aluminum layer. The second aluminum layer is a wiring layer formed above the first aluminum layer with an insulation layer disposed therebetween.

A CMOS inverter constituted by P and N-channel MOS transistors is formed in a comb-shaped pattern in the circuit element region 11. More specifically, the drain of the P-channel MOS transistor is formed of diffusion layers 51a and 51b, and the source and gate electrode thereof are respectively formed of a diffusion layer 52 and a polysilicon wiring layer 53. Further, the drain of the N-channel MOS transistor is formed of diffusion layers 54a and 54b and the source and gate electrode thereof are respectively formed of a diffusion layer 55 and the polysilicon wiring layer 53.

The polysilicon wiring layer 53 is formed below the first aluminum layer so as to be connected to an input wiring 56a formed of the second aluminum wiring via two contact portions. One of the two contact portions is used to connect the polysilicon wiring layer 5 to the first aluminum wiring and the other contact portion is used to connect the first aluminum wiring layer to the input wiring 56a. Likewise, the polysilicon wiring layer 53 is also connected to an input wiring 56b formed of the second aluminum wiring layer via two contact portions.

The source diffusion layer 52 of the P-channel MOS transistor is connected to the positive power source wiring VDD formed of the first aluminum wiring via a source electrode 203 formed of the first aluminum layer and a power source connection wiring 57 formed of the second aluminum layer. Further, the source diffusion layer 55 of the N-channel MOS transistor is connected to the negative power source wiring Vss formed of the first aluminum wiring via a source electrode 204 formed of the first aluminum layer and a power source connection wiring 58 formed of the second aluminum layer. The drain diffusion layer 51a which is on of the two diffusion layers of the P-channel MOS transistor is connected to an output wiring 59 formed of the second aluminum layer via a drain electrode 205 formed of the first aluminum layer and a wiring layer 202 formed of the second aluminum layer. Further, the other drain diffusion layer 51b of the P-channel MOS transistor is connected to the output wiring 59 formed of the second aluminum layer via a drain electrode 206 formed of the first aluminum layer. The drain diffusion layer 54a which is one of the two diffusion layers of the N-channel MOS transistor is connected to the output wiring 59 formed of the second aluminum layer via a drain electrode 207 formed of the first aluminum layer and a wiring layer 201 formed of the second aluminum layer. Further, the other drain diffusion layer 54b of the N-channel MOS transistor is connected to the output wiring 59 formed of the second aluminum layer via a drain electrode 208 formed of the first aluminum layer.

Further, in the internal wiring region 13a, a cell connection wiring 60 formed of the first aluminum layer is arranged in parallel with the positive power source wiring VDD and is connected to a wiring 61 formed of the second aluminum layer. In the internal wiring region 13b, a cell connection wiring 62 formed of the first aluminum layer is arranged in parallel with the negative power source wiring Vss and is connected to a wiring 63 formed of the second aluminum layer.

Thus, the dimension of the circuit element region 11 in the Y direction can be reduced by forming the P- and N-channel MOS transistors in a comb-shaped pattern. As a result, the width of each of the internal wiring regions 13a and 13b can be made sufficiently large while the height of the standard cell Cb or the dimension of the cell Cb in the Y direction is kept at the same value as that of the conventional cell shown in FIG. 1.

In FIG. 7B, an unobserved portion is shown in broken lines so that the cell structure can be easily understood.

Figure 8:
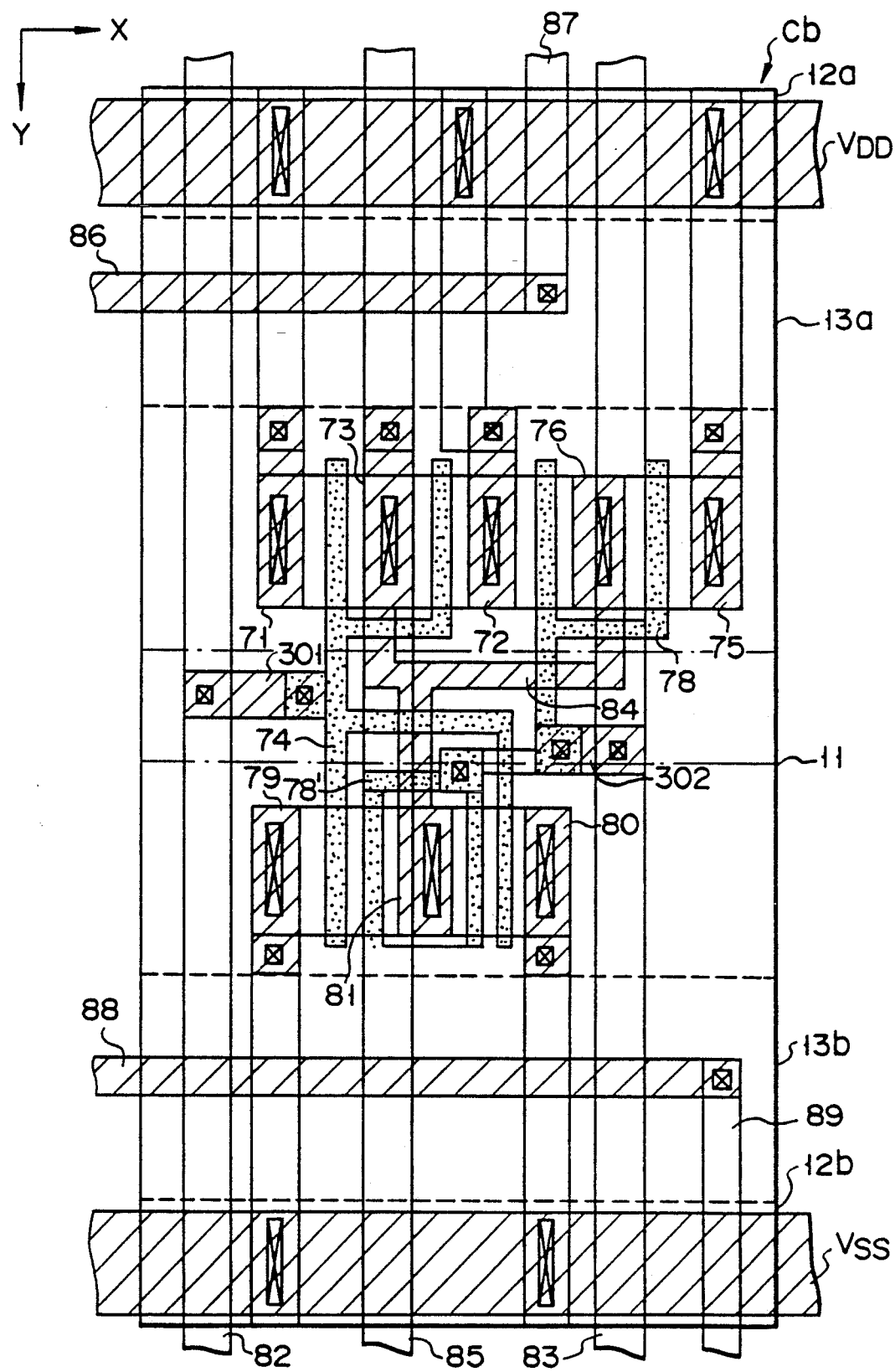
FIG. 8 is a plan view showing a concrete wiring pattern obtained in a case where a two-input NAND gate is formed in the cell of FIG. 3.

FIG. 8 shows the concrete cell structure obtained in a case where a two-input NAND gate is formed in the cell Cb shown in FIG. 3. As shown in FIG. 8, two P-channel MOS transistors and two N-channel MOS transistors are formed in a comb-shaped pattern to constitute a two-input NAND gate in a circuit element region 11. One of the two P-channel MOS transistors is constituted by source diffusion layers 71 and 72, a drain diffusion layer 73 and a gate electrode formed of a polysilicon wiring 74. The other P-channel MOS transistor is constituted by source diffusion layers 72 and 75, a drain diffusion layer 76 and a gate electrode formed of a polysilicon wiring 78.

One of the two N-channel MOS transistors is constituted by source diffusion layers 79 and 80, a drain diffusion layer 81 and a gate electrode formed of the polysilicon wiring 74. The other N-channel MOS transistor is constituted by the source diffusion layers 79 and 80, the drain diffusion layer 81 and a gate electrode formed of a polysilicon wiring 78'.

The polysilicon wiring layer 74 is connected to a first input wiring layer 82 formed of a second aluminum layer via a wiring layer 301 formed of a first aluminum layer. The polysilicon wirings 78 and 78' are connected to a second input wiring layer 83 formed of the second aluminum layer via a wiring layer 302 formed of the first aluminum layer. Further, the diffusion layers 73 and 76 acting as the drains of the two P-channel MOS transistors, and the diffusion layer 81 acting as the common drain of the two N-channel MOS transistors, are connected to an output wiring 85 formed of the second aluminum layer via an electrode wiring layer 84 formed of the first aluminum wiring.

In the internal wiring region 13a, a cell connection wiring layer 86 formed of the first aluminum layer is arranged in parallel with the positive power source wiring VDD, and is connected to a wiring layer 87 formed of the second aluminum layer. Further, in the internal wiring region 13b, a cell connection wiring layer 88 formed of the first aluminum layer is arranged in parallel with the negative power source wiring Vss and is connected to a wiring layer 89 formed of the second aluminum layer.

With this construction, since each of the transistors of the two-input NAND gate is formed in a comb-shaped pattern, the width of the internal wiring regions 13a and 13b can be made sufficiently large while the height of the cell or the dimension of the cell in the Y direction is kept at the same value as that of the conventional cell.

As described above, it is possible to realize a wiring layout which has a high degree of freedom, without increasing the width of the wiring region between the cell rows, by forming the internal wiring region in the standard cell. As a result, an LSI can be easily formed in a small chip area with high density.

What is claimed is:

1. A semiconductor integrated device comprising:
   a plurality of standard cell rows extending in a first direction, each row including first standard cells;
   a wiring region, which is arranged between two adjacent ones of said standard cell rows and in which cell connection wirings are formed;
   wherein at least one said standard cell row includes at least one second standard cell; and
   said at least one second standard cell contains an internal wiring region containing a cell connection wiring arranged in said first direction and having two ends, one of said two ends being coupled to one of the wirings formed in said wiring region, and the other of said two ends being coupled to another of the wirings formed in said wiring region; said second cell contains a positive power source line region in which a positive power source line is formed; and said second cell contains a negative power source line region in which a negative power source line is formed.

2. A semiconductor integrated circuitu device according to claim 1, wherein said internal wiring region is arranged between said positive and negative power source line regions and the cell connection wiring formed in said internal wiring region is arranged in parallel with said positive and negative power source lines.

3. A semiconductor integrated circuit device according to claim 1, wherein said at least one second standard cell further includes a circuitu element region in which a logic gate is formed; said positive and negative power source lines being connected to the logic gate formed in said circuit element region; and the cell connection wiring formed in said internal wiring region being arranged parallel to said positive and negative power source lines.

4. A semiconductor integrated circuitu device comprising:
   a plurality of standard cell rows extending in a first direction, each row including first standard cells;
   a plurality of wiring regions, each of which is situated between adjacent said standard cell rows, and in each of which cell connection wirings are formed;

wherein at least one said standard cell row includes at least one second standard cell; and said at least one second standard cell contains a circuit element region in which a logic gate is formed; said second cell contains a positive power source line region in which is formed a positive power source line for supplying a positive power source potential to the logic gate formed in said circuitu element region; said second cell contains a negative power source line region in which is formed a negative power source line for supplying a negative power source potential to the logic gate formed in said circuit element region; said second cell contains a first internal wiring region containing a first cell connection wiring arranged in said first direction and having two ends, said two ends of said first cell connection wiring being respectively coupled to separate wirings formed in one of two of said adjacent wiring regions, said at least one standard cell row including said second cell being located between said two wiring regions, said first internal wiring region being situated between said positive power source line region and said circuit element region; and said second cell contains a second internal wiring region containing a second cell connection wiring arranged in said first direction and having two ends, said two ends of said second cell connection wiring being respectively coupled to separate wirings formed in the other of said two wiring regions, said second internal wiring region being situated between said negative power source line region and said circuitu element region.

5. The semiconductor integrated circuit device of claim 4 wherein at least one said standard cell row further contains at least one third standard cell containing a positive power source line region in which a positive power source line is formed; said third standard cell contains a negative power source line region in which a negative power source line is formed; and said third standard cell contains an internal wiring region, wherein cell connection wirings are arranged in the first direction, and which is situated between said positive power source line region and said negative power source line region.

* * * * *